United States Patent [19]

Bischer, Jr. et al.

[11] Patent Number: 5,262,194
[45] Date of Patent: Nov. 16, 1993

[54] METHODS AND APPARATUS FOR CONTROLLING FILM DEPOSITION

[75] Inventors: Carmen B. Bischer, Jr., Hayward; Edward A. Small, Jr., Santa Rosa, both of Calif.

[73] Assignee: Dielectric Coating Industries, Hayward, Calif.

[21] Appl. No.: 36,344

[22] Filed: Mar. 24, 1993

Related U.S. Application Data

[63] Continuation-in-part of Ser. No. 973,000, Nov. 10, 1992, abandoned.

[51] Int. Cl.⁵ ..................... C23C 14/24; C23C 14/54
[52] U.S. Cl. .......................................... 427/9; 427/10; 427/248.1; 427/255.5; 427/255.7; 118/664; 118/718; 118/726; 118/727; 118/729
[58] Field of Search ............... 118/718, 726, 727, 729, 118/664; 427/9, 10, 248.1, 255.5, 255.7

[56] References Cited

U.S. PATENT DOCUMENTS

| | | | |
|---|---|---|---|
| 3,383,238 | 5/1968 | Unzicker | 118/664 |
| 4,579,083 | 4/1986 | Boivin | 118/664 |
| 4,669,418 | 6/1987 | Dwyer | 118/664 |

Primary Examiner—Richard Bueker
Attorney, Agent, or Firm—H. Michael Brucker

[57] ABSTRACT

Apparatus and method for increasing the time that a quartz crystal can sense the rate at which evaporated material is broadcast onto a substrate wherein a chopper employing a disk with a slot is disposed between the source of the evaporated material and the crystal to reduce the exposure of the crystal to evaporated material to a fraction of the time that the substrate is exposed wherein the chopper frequency is not in tune with the dither frequency of the material evaporator. Barrier means prevents the chopper slot from significantly changing dimensions due to the build up of material on its defining edges, while shield means prevents the a crystal from being exposed to evaporated material from a source that it does not control.

37 Claims, 5 Drawing Sheets

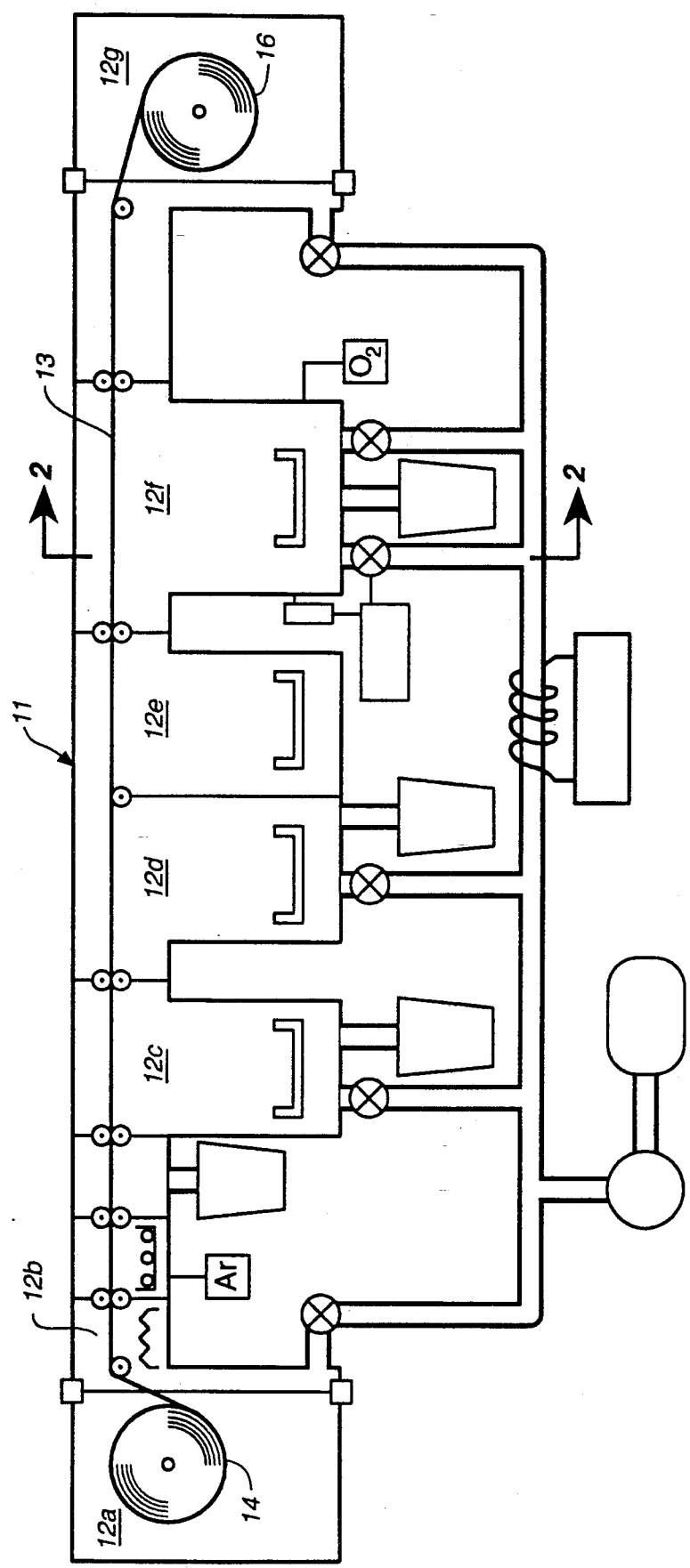
FIG._1

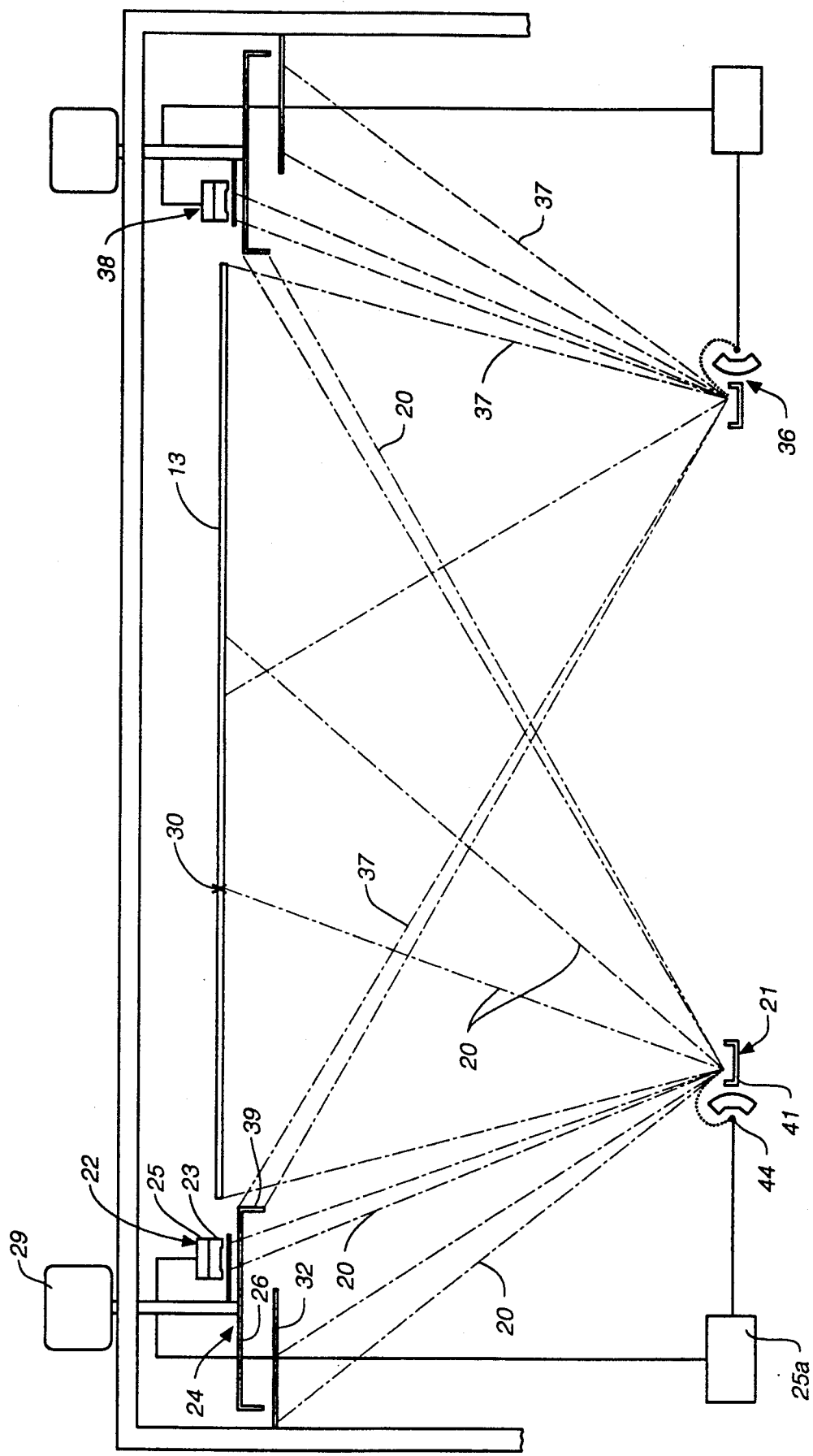
FIG._2

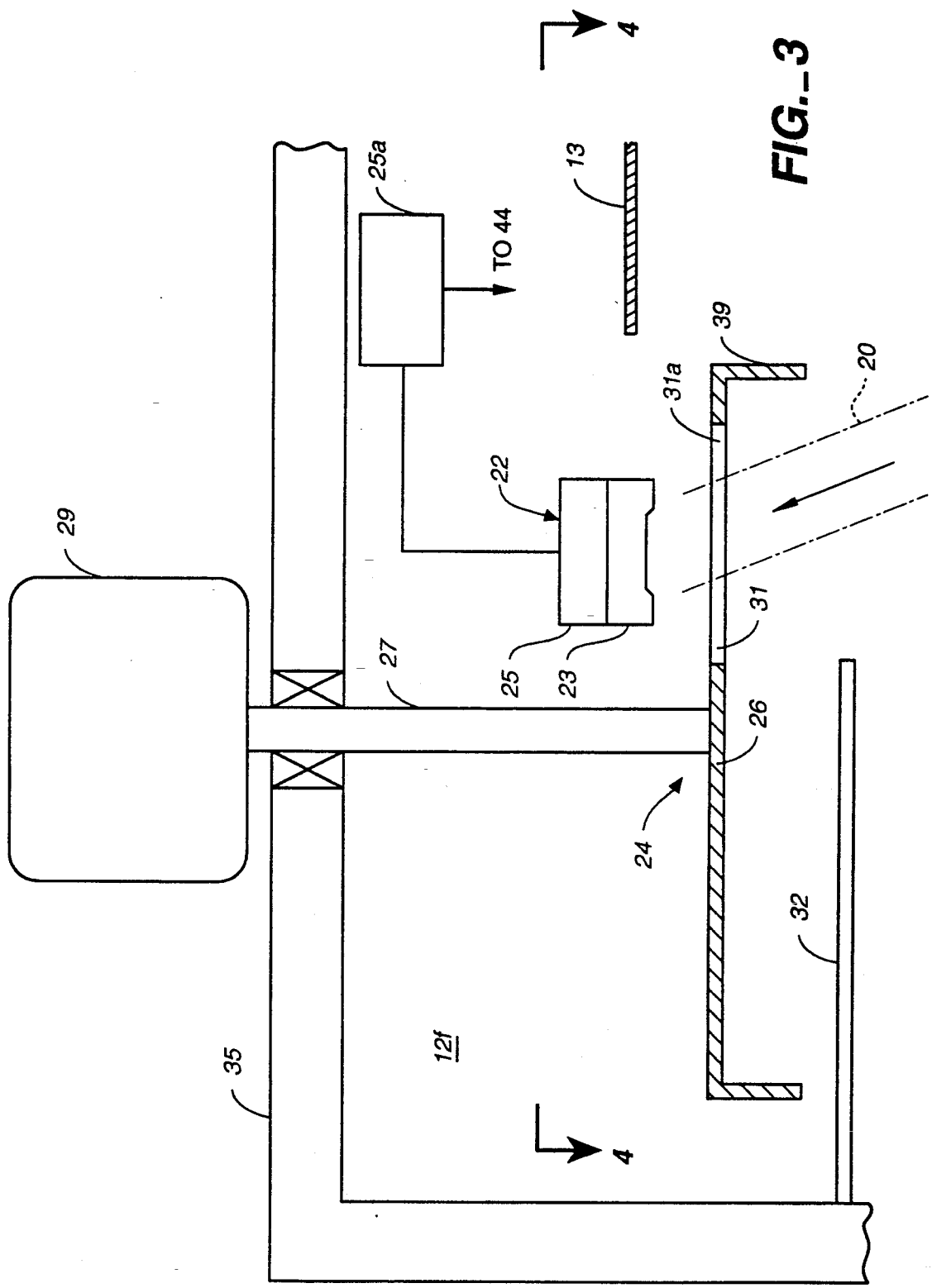

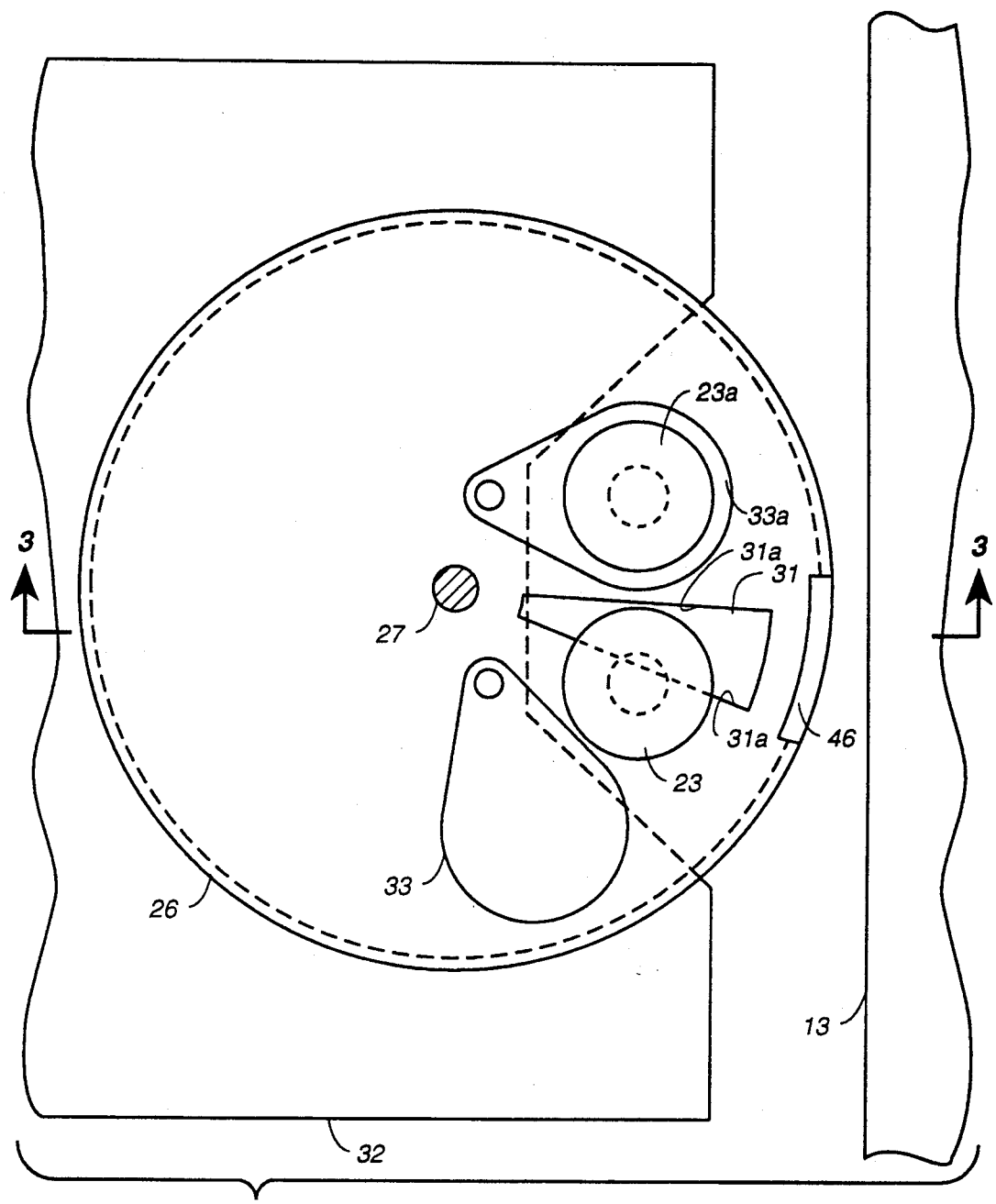
FIG._4
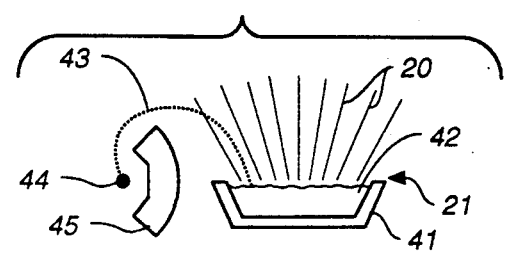
FIG._5

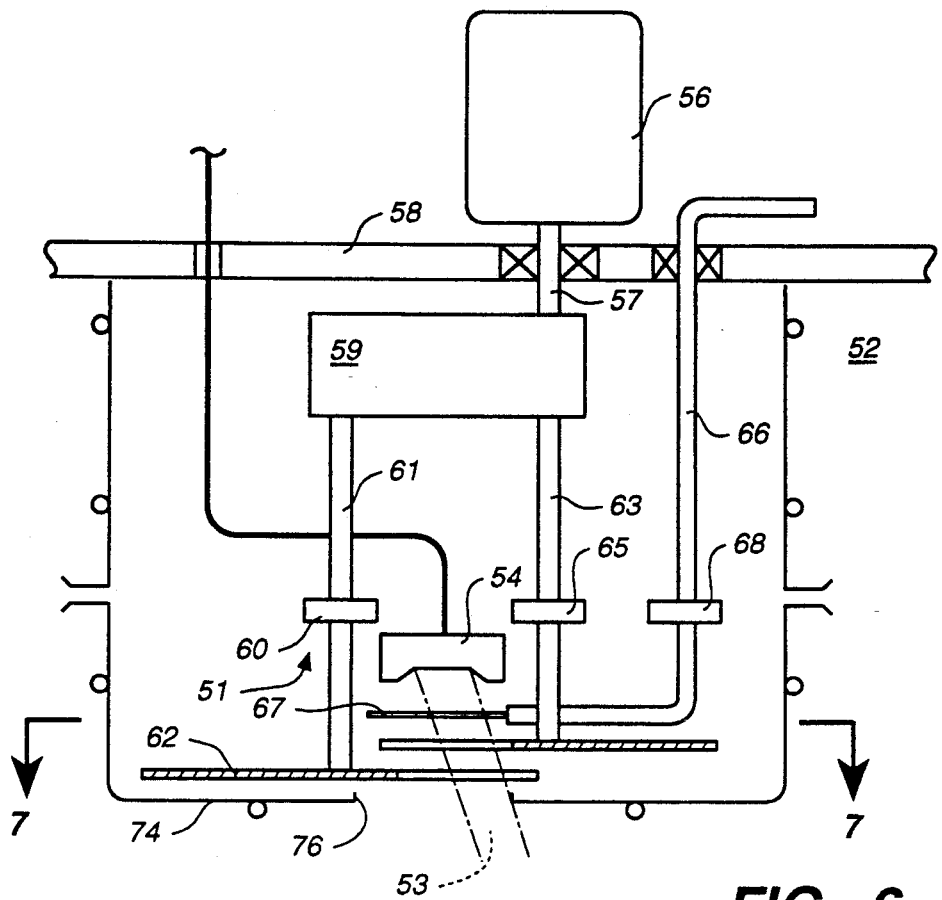
FIG._6
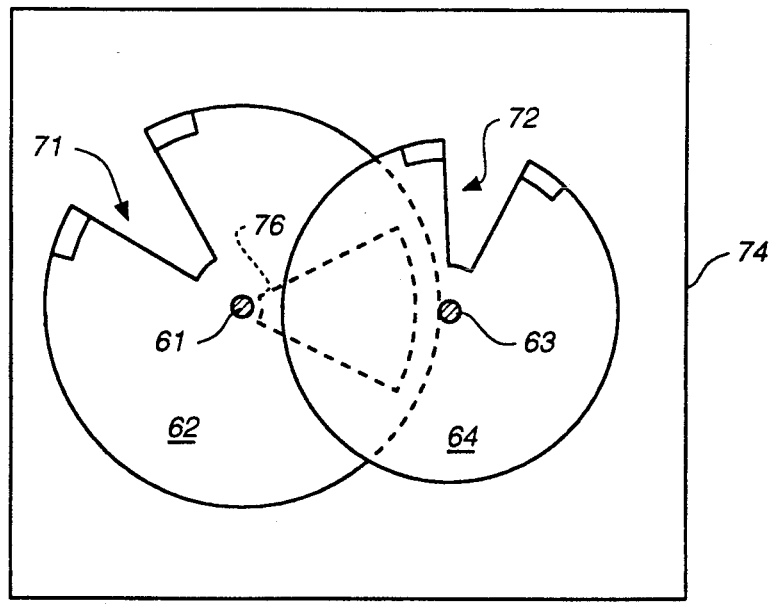
FIG._7

025
METHODS AND APPARATUS FOR CONTROLLING FILM DEPOSITION

This is a continuation-in-part of copending application Ser. No. 07/973,000 filed on Nov. 10, 1992, abandoned.

BACKGROUND OF THE INVENTION

1. Field of the Invention

The present invention relates to controllers for film deposition processes and in particular to controllers that use a quartz crystal as the sensor element.

2. Prior Art

Oscillating quartz crystals have long been used as sensor elements in the control of film deposition onto a substrate (web). (Leybold Inficon Inc. of East Syracuse, N.Y., presently offers a line of crystals and control circuits for precisely that purpose). Typically these crystals are part of an electrical circuit that causes the crystal to oscillate at a particular frequency. The crystal is disposed in the film deposition chamber and coated by the same process that applies the film to the web. As the crystal becomes coated, its frequency of oscillation changes and the rate of frequency change is a measures of the rate at which film is being deposited onto the web. When the detected frequency indicates that the rate of deposition is too high or too low, the deposition rate is changed until the rate of change of crystal oscillation is again within a specified range.

One of the major drawbacks of quartz crystal detection controllers, as known in the art, is that they require that the crystal be replaced after relatively short deposition runs due to the fact that after the crystal is coated to a certain level, it stops working. Some systems extend the controller operation time by using two crystals, with one being masked (inactive) until the first is coated to the point where it stops working and then the second crystal is unmasked (activated). But even in these dual crystal systems, coating runs last only five to twenty minutes before the crystals must be replaced. While these controllers have been acceptable for film deposition processes that can be completed within short time limits, (such as plate coating) they are not useful for processes that last longer than twenty minutes and which cannot be stopped prior to completion to change crystals, such as continuous coating of rolled material.

Thus, it is an object of the present invention to provide improvements in film deposition controllers including extending the length of time that a single crystal can operate as an accurate sensor of film deposition rate to as much as eight hours and more.

It is another object of the present invention to permit a pair of crystal sensors to operate in the same deposition chamber without either interfering with the operation of the other.

A further object of the present invention is to provide methods for extending the time that a quartz crystal can operate as a sensor of material deposition rate in a film deposition process.

SUMMARY OF THE INVENTION

In the present invention, a crystal sensor forming part of a controller is disposed within a deposition chamber at the level of a continuously moving web to receive deposition material at the same rate as a typical location on the web.

To extend the operative life of the crystal, a chopper is disposed between the crystal and the source of the deposition material to reduce the amount of material deposited onto the crystal to a small percent of that deposited onto the web itself. In one embodiment, the chopper is a disk with a slot formed in it and rotated at several revolutions per second. The only time that deposition material is deposited onto the crystal is when the slot is aligned with the crystal. At all other times, the crystal is masked from the deposition material by the disk.

Because the deposition material is produced by an electron beam dithering in a source of film material, the evaporated material is produced and directed at the web (and the crystal) at a varying rate that is generally sinusoidal. To insure that the chopper does not distort the rate at which film is actually being deposited onto the web, the chopper frequency must be controlled not to be in phase with the dither frequency of the evaporation apparatus.

The crystal life is extended in the present invention by reducing the exposure time of the crystal to a fixed small percent of the exposure time of the web. In order for the crystal oscillation rate change to be an accurate measure of the deposition rate onto the web, it is imperative that the percentage of time that the chopper exposes the crystal to coating material remain essentially constant during a run. The present invention teaches a number of steps to keep that percentage constant.

One of the ways that the crystal exposure time can change is by the slot size changing (the slot getting smaller). A build up of deposition material on the edges of the slot reduces the slot size and thus the exposure time of the crystal. To keep the slot size shrinkage to a minimum, the disk uses a single slot (where the selected crystal exposure time is 10%, for example, two 5% slots will reduce twice as fast as one 10% slot). Since the chopper disk may rotate at several hundred rpm, it may be necessary to counterbalance the disk to compensate for the imbalance introduced by the single slot.

Another step taught by the present invention to keep the slot from effectively shrinking is to dispose a barrier between the disk and the evaporated material source except where the disk aligns with the crystal. In this way the slot is only exposed to deposition material (and thus edge build-up) when it exposes the crystal, the rest of the time it is protected from deposition material by the barrier.

For a wide web it is advantageous to have two sources of material operating together in a single chamber. A controller using the crystal arrangement of the present invention, as described above, is used for each crystal. To prevent the evaporated material from one source from coating the crystal controlling the other source, a shield is attached to the chopper disk to prevent any material other than that from the source that it controls from reaching the crystal. The shield can take several forms including that of a depending skirt along the rim of the disk which blocks any material from the other source from reaching the crystal but not obstructing the crystal from material from the source that that crystal controls.

BRIEF DESCRIPTION OF THE DRAWINGS

FIG. 1 is a schematic diagram of a coating chamber in which the present invention is useful;

FIG. 2 is an elevation view taken along the line 2—2 of FIG. 1.

FIG. 3 is an enlarged view of the crystal and chopper shown in FIG. 2;

FIG. 4 is a top view of the chopper and crystal that form part of the invention;

FIG. 5 is an enlarged side view of the electron beam and material source shown schematically in FIG. 2;

FIG. 6 is an enlarged view of the crystal and chopper shown in FIG. 2 wherein two chopper disks are employed; and FIG. 7 a plan view taken along the line 7—7 of FIG. 6.

DESCRIPTION OF PREFERRED EMBODIMENT

Referring to FIG. 1, a vacuum chamber 11 is subdivided into a number of vacuum compartments 12a–12g where various operations are applied to the web 13 of a substrate material being continuously fed from a feed roll 14 to a rewind roll 16. The operations in the initial compartments 12a–12e prepare the substrate for the deposition of a film of material in compartment 12f, for example. It may take as long as eight hours to complete the film deposition process of an entire roll of material. For greater details of the operations in the various compartments see applicants pending patent application Ser. No. 07/919,768 for Improvements in the Method and Apparatus of Vacuum Deposition, filed Jul. 24, 1992.

The present invention relates to improvements in controllers that monitor and adjust the rate of deposition of material onto the moving web 13 in compartment 12f.

Referring to FIGS. 2 and 3, a film material source 21 broadcasts evaporated material 20 onto the moving web 13. A material deposition rate sensor 22 comprising crystal sensor 23 and a rate controller 25 produces a signal that is delivered to an electron gun emission controller 25a that controls the rate at which material is broadcast out of source 21 and onto the web 13. In this way a consistent film coat can be applied over the entire length of the web 13.

The heart of the sensor 22 is a crystal 23 that oscillates at a rate that changes as it becomes coated with evaporated material. The rate of crystal oscillation change is a measure of the rate at which material is deposited onto the web 13. When the deposition rate detected is other than that desired, the controller 25 sends a signal that either increases or decreases the deposition rate. At some point, the coating of the crystal 23 builds up to a level at which the crystal stops oscillating and the controller no longer functions.

The present invention greatly extends the useful life of a crystal so that it is possible to accurately control an entire run of a roll of material (which might take eight hours or more) without having to replace the crystal.

For the greatest accuracy, the crystal 23 is most advantageously located at or near the plane of the web 13 so that any pressure changes in the chamber which effect the deposition of material onto the web 13, will effect the deposition onto the crystal 23 equally and the appropriate correction will be made. Because material 20 is broadcast equally in all directions from source 21, the rate of deposition onto crystal 23 is the same as the rate of deposition onto a typical web area 30 which is at the same distance and angle from source 21 as is crystal 23. Thus, the crystal 23 "sees" the same deposition rate as a typical location on the web 13.

To reduce the build up of deposition material onto the crystal 23, and thereby extend the useful life of the crystal, a chopper means 24 is disposed between the crystal 23 and the material source 21. The chopper means 24 effectively reduces the deposition material that reaches the crystal 23 to a small fraction of that which reaches the web 13. Since it is the rate of film build up on the crystal 23 that is being detected (crystal oscillation rate change), a fixed small fraction of the material being directed at the crystal (and the web) is also an accurate measure of the deposition rate onto the web.

Referring, in addition, to FIG. 4, the chopper means 24 comprises an opaque circular disk 26 mounted on the end of a shaft 27 that extends through the upper wall 35 of vacuum compartment 12f. The other end of the shaft is attached to a drive motor 29 that turns the shaft 27 and thus the chopper disk 26. A pie-shaped slot 31 formed in the disk 26 permits the crystal 23 to be exposed to the broadcast evaporated material 20 whenever the slot 31 aligns with the crystal 23 (as illustrated in FIG. 3). The size of the slot determines what percent of the time the crystal is exposed to deposition material 20. A slot that exposes the crystal 5% of the time greatly extends the life of the crystal while still permitting a sufficient sample of the deposition material to be received by the crystal to accurately control the process. Even where the slot is larger and the crystal is exposed 10% or 20% of the time, significant improvement in the useful life of the crystal is realized.

As deposition material 20 passes through slot 31, some of the material coats the slot edges 31a, reducing the slot area, and as a consequence the time that the crystal is exposed to deposition material. Since the time of exposure needs to remain constant for accuracy, slot edge build-up must be minimized. In the present invention the error due to slot size changes is minimized to the point that it is not a factor. This is accomplished in two ways. First, the number of slots is kept to one. Two 5% slots will decrease in size twice as fast as one 10% slot since the change in size is proportional to the number of slot edges that are being coated. Secondly, a barrier plate 32 is disposed between the chopper disk 23 and the source 21 such that the only area of the disk 23 exposed to material 20 is that immediately adjacent the crystal 23. In this way the slot edges 31 are only coated with material 20 for the fraction of the time that the slot 31 aligns with the crystal to permit the crystal to receive deposition material 20. At all other times the slot is protected from the material 20 by the barrier 32.

In the present invention, as in prior art devices, the overall controller operation time can be doubled by using two crystals 23 and 23a (see FIG. 4), each having a shutter 33 and 33a respectively that closes over the crystal when it is not the operative crystal.

Where a relatively thick layer of material is to be applied to the web, even a two crystal arrangement may not be sufficient to permit accurate controller operation for the entire run of a roll of substrate. The present invention includes an embodiment in which two chopper disks are used in a way that allows controller operation to continue for the full run of the web material for depositions of relatively thick lawyers of material.

Referring to FIGS. 6 and 7, a dual-disk chopper means 51 is disposed in a vacuum chamber 52 to control the amount of deposition material 53 that reaches a control crystal 54. The chopper means includes a drive motor 56 (located outside the vacuum chamber 52) having a shaft 57 that extends through a wall 58 of the chamber 52 into a gear box 59. A first chopper shaft 61 depends from gear box 59 through a bearing 60 and carries at its distal end a first chopper disk 62, while a second chopper shaft 63 depends from the gear box 59 through bearing 65 and carries a second chopper disk 64 at its distal end. A control arm 66 extending through bearing 68 carries a shutter 67 that is selectively moved in and out of the path of the deposition material 53 to the crystal 54.

The chopper disk 62 has a pie-shaped cutout (slot) 71 that periodically aligns with the crystal 54 as the disk 62 rotates. Similarly, the chopper disk 64 has a pie-shaped cutout (slot) 72 that periodically aligns with the crystal 54 as the disk 64 rotates. The deposition material 53 on a path to the crystal 54 will only reach the crystal when both slots 71 and 72 are aligned with the crystal. At all other times, either the disk 62 or the disk 64 will block the material 53 from reaching the crystal. In this way a reduction to one percent (1%) or less of the deposition material being direct at the crystal can be achieved without having to use disks with narrow slots subject to error producing material buildup. The use of a single disk with a one percent (1%) slot or similarly low percentage would not be effective as the slot would change its dimensions significantly during the run and thus the percentage of material being seen by the crystal would fluctuate.

In contrast, by using two disks with relatively large slots, the percentage of material reaching the crystal remains constant over the entire run as the build up of material on the slots is insignificant in comparison to the slot sizes.

In order for the crystal 54 to function effectively to control the material deposition rate, it must receive a representative sample of the deposition material being broadcast onto the web (not shown). This is achieved by selecting gearing in the gear box 59 that drives the disks at relative speeds that produces several revolutions of the disk 64 while the slot 71 of disk 62 is aligned with the crystal 54. That is to say, during the time that it takes disk 62 to travel a distance equal to its slot 71, disk 64 rotates more than one revolution and preferably two or three.

By way of example, if the slot 71 is 36 degrees or 10% of the disk, and the slot 72 is 18 degrees or 5% of the disk, the crystal 54 will see 0.5% of the material 53. If the motor operates at 3,000 rpm and the gear reduction to shaft 61 is 30:1 and to shaft 63 is 1:1, disk 62 will rotate at 100 rpm while disk 64 rotates at 3,000 rpm. Slot 72 will pass slot 71 three times during the time it takes slot 71 to pass over the crystal 54. Thus, for each revolution of disk 62, crystal 54 gets three samples of the deposition material 53. The crystal 54, however, is only exposed to ½% of the deposition material and can therefore sustain operation for an extended period of time before the buildup shuts down the crystal.

To minimize the build up of deposition material onto disks 62 and 64, a barrier means 74 having a pie-shaped opening 76 is disposed around the chopper means 51 to prevent the deposition material 53 from coating the disks 62 and 64 at all times other than when they are aligned with the crystal 53 and opening 76.

Referring to FIG. 2, a second source 36 of deposition material 37 within compartment 13 provides material that coats webs 13 along with source 21. The source 36 is controlled by its own crystal sensing controller 38 which is identical to that described above including chopper means. In order to keep any of material 37 from coating crystal 23 (and thereby interfering with the control of source 21) a shield means is provided. Disk 26 has a circumferential skirt shield 39 depending from the disk rim that blocks any material from source 36 from reaching the crystal 23. Similarly, none of the material from source 21 will be able to reach the crystal of the controller 38 due to its disk also having a depending shield. Thus, each controller independently operates in response to one source only.

Referring to FIG. 5, the material source 21 comprises a container 41 of deposition material 42 that provides an evaporation stream 20 when an electron beam 43 from a hot filament 44 is directed onto the material 42 by an emitter 45 (only a portion of which is shown) and a magnetic field (not shown) as is well known in the art. As is also well known in the art, the material 42 is most efficiently evaporated by moving (dithering) the electron beam 43 over a broad area of the container 41. The material 42 evaporated by the beam 43 is driven toward the web 13 by thermal energy at a rate that is dependent on the surface temperature of material 42. The surface temperature of the material 42 is a function of the length of time the electron beam 43 is in one spot of material 42 and the beam's focus, both of which change as the beam is dithered (the electron beam is moved laterally and longitudinally over the material 42). The dwell time at the locations of direction reversal creates relatively higher temperatures, for example. Thus, the rate of material dispersion changes cyclically as a function of the dither frequency. It is necessary to detune the chopper frequency from the dither frequency to prevent the two from operating in phase and thereby producing an erroneous deposition rate signal at the crystal 23.

The chopper frequency (the number of times per minute that the slot 31 aligns with the crystal 23) is preferably several times greater than the controller sample rate. Controllers known in the art and commercially available typically sample the crystal frequency about 2 to 3 times per second (120 to 180 times per minute). The best results are achieved when a number of applications of the deposition material occur between sampling of the crystal by the controller circuit. Thus, a chopper speed in the range of 300 to 700 rpm is preferred for typical sampling rates. At chopper speeds of several hundred rpm the imbalance of the disk 26 caused by the single slot 31 is advantageously compensated by a counterbalance 46 attached to the edge of the disk 26 near slot 31. Other ways of counterbalancing the disk for high speed operation are possible and will readily occur to those skilled in the art.

The present invention includes the method of extending the time of operation of a quartz crystal as a sensor of deposition rate in a deposition process the steps including reducing the amount of material that is received by the crystal over time by alternatively protecting the crystal from and exposing the crystal to deposition material at a frequency of at least once per second.

The invention is susceptible to a number of variations and equivalents that are within the teachings of the invention such that the invention is not limited to the precise embodiments illustrated and described.

The invention having been fully described, it is not to be limited to the details herein set forth, but is of the full scope of the appended claims.

What is claimed is:

1. In a control system utilizing a crystal for monitoring the rate of deposition of vaporized material from a material source, the improvements comprising:

chopper means disposed between the source of vaporized material and the crystal, wherein said chopper means alternatively blocks vaporized material from reaching the crystal and permits vaporized material to reach the crystal at a frequency of at least once per second.

2. The invention of claim 1 wherein:
said chopper includes a rotatable disk with a slot formed therein.

3. The invention of claim 2 wherein:
said slot in said disk exposes the crystal to the vaporized material 20% or less of the time when said disk is rotating.

4. The invention of claim 3 wherein:
said slot in said disk exposes the crystal to the vaporized material 10% or less of the time when said disk is rotating.

5. The invention of claim 4 wherein:
said slot in said disk exposes the crystal to the vaporized material approximately 5% of the time when said disk is rotating.

6. The invention of claim 1 wherein:
the chopper means alternates at a rate of 300 revolutions per minute or more.

7. The invention of claim 2 wherein:
said disk rotates at a rate of 300 revolutions per minute or more.

8. The invention of claim 1 further comprising:
shield means disposed to block all vaporized material directed toward the crystal from a particular direction from reaching the crystal.

9. The invention of claim 2 further comprising:
shield means disposed to block all vaporized material directed toward the crystal from a particular direction from reaching the crystal.

10. The invention of claim 9 wherein:
said shield means is a skirt depending from the rim of said disk.

11. The invention of claim 1 further comprising:
barrier means disposed between the vaporized material and said chopper means wherein a portion of said chopper means is always protected from vaporized material.

12. The invention of claim 2 further comprising:
barrier means disposed between the vaporized material and said disk wherein a portion of said disk is always protected from vaporized material.

13. The invention of claim 12 wherein:
the portion of said disk protected by said barrier means is the portion of the disk not adjacent to the crystal.

14. The invention of claim 9 further comprising:
barrier means disposed between the vaporized material and said disk wherein a portion of said disk is always protected from vaporized material.

15. The invention of claim 11 wherein:
the portion of said disk protected by said barrier means is the portion of the disk not adjacent to the crystal.

16. The invention of claim 2 wherein:
said slot is the only crystal exposing slot in said disk and said slot exposes the crystal to the vaporized material approximately 10% of the time or less when said disk rotates.

17. The invention of claim 16 further comprising:
counterbalance means on said disk to rotationally compensate for said slot.

18. The invention of claim 1 wherein the material is deposited onto a moving web, and wherein:
the crystal is disposed at approximately the same distance from the source of material as a location on the web.

19. The invention of claim 2 wherein the material is deposited onto a moving web, and wherein:
the crystal is disposed at approximately the same distance from the source of material as a location on the web.

20. The invention of claim 1 wherein the material source includes a moving vaporizer means that operates at a dither frequency and wherein the dither frequency and the chopper blocking frequency are not in phase.

21. The invention of claim 2 wherein the material source includes a moving vaporizer means that operates at a dither frequency and wherein the dither frequency and the rotatable disk frequency are not in phase.

22. The invention of claim 1 wherein said chopper means includes:
a first rotatable chopper disk with a slot formed therein;
a second rotatable chopper disk with a slot formed therein, and
means operable to rotate said chopper disks at different speeds.

23. The invention of claim 22 further comprising:
means operable to rotate said disks at different speeds.

24. The invention of claim 22 wherein:
the speed of one of said disks is at least ten times the speed of the other said disk.

25. The invention of claim 22 wherein:
said disks are disposed to have their respective slots align periodically.

26. The invention of claim 24 wherein the alignment period is less than 3% of the time.

27. The invention of claim 24 wherein the faster of said disks rotates at least twice in the time that it takes for the slower of said disks to rotate the distance of its own slot.

28. The invention of claim 26 further comprising:
barrier means having an opening formed therein disposed between the material source and said chopper means restricting vaporized material coating said chopper means.

29. In a control system utilizing a first crystal for monitoring the rate of deposition of vaporized material from a first material source onto a moving web, and a second crystal for monitoring the rate of deposition of vaporized material from a second material source onto the moving web, the improvements comprising:
first chopper means disposed between the first source of vaporized material and the first crystal;
second chopper means disposed between the second source of vaporized material and the second crystal;
wherein said first and second chopper means alternatively block vaporized material from reaching the crystals and permit vaporized material to reach the crystals, at a rate of at least once per second.

30. The invention of claim 29 further comprising:
shield means disposed to block from the first crystal all vaporized material from the second source and from the second crystal all vaporized material from the first source.

31. A method for extending the operative time of an oscillating quartz crystal in a material deposition chamber where vaporized material is broadcast toward a substrate and the crystal the steps including:

reducing the amount of material that is received by the crystal over time by alternatively blocking the crystal from and exposing the crystal to deposition material at a frequency of at least once per second.

32. The method of claim 31 wherein the deposition material is broadcast toward the crystal at a varying rate having a frequency, the additional step of:

selecting a frequency of alternatively blocking the crystal from and exposing the crystal to deposition material that is not in phase with the frequency of the rate at which material is broadcast toward the crystal.

33. The method of claim 31 wherein the frequency of alternatively blocking the crystal from and exposing the crystal to deposition material is 100 rpm or less.

34. The method of claim 31 wherein the frequency of alternatively blocking the crystal from and exposing the crystal to deposition material is 600 rpm or less.

35. The method of claim 31 wherein the frequency of alternatively blocking the crystal from and exposing the crystal to deposition material is 300 rpm or more.

36. The method of claim 31 wherein the reduction of the amount of material that is received by the crystal is accomplished by a first reduction to a percent of the amount directed at the crystal and then by a reduction to a percent of the reduced amount.

37. The method of claim 36 where the amount of material received by the crystal is less than 3%.

* * * * *